United States Patent [19]

Cellerino

[11] Patent Number: 4,600,896
[45] Date of Patent: Jul. 15, 1986

[54] CIRCUIT FOR LIMITING JITTER TRANSIENTS DURING SWITCHING OF PHASE CONTROL SIGNALS TO AN OSCILLATOR

[75] Inventor: Giuliano Cellerino, Milan, Italy

[73] Assignee: GTE Communication Systems Corporation, Northlake, Ill.

[21] Appl. No.: 654,337

[22] Filed: Sep. 25, 1984

[51] Int. Cl.[4] .............................................. H03L 7/10
[52] U.S. Cl. ........................................ 331/11; 331/14; 331/17; 331/25
[58] Field of Search ..................... 331/10, 11, 14, 17, 331/25; 332/9 R, 19; 375/25, 120

[56] References Cited

U.S. PATENT DOCUMENTS 4,511,859  4/1985  Dombrowski ...................... 331/11

Primary Examiner—Siegfried H. Grimm
Attorney, Agent, or Firm—Charles A. Doktycz

[57] ABSTRACT

A phase comparator is included with each incoming channel to compare the clock phase of the incoming signal and a local oscillator. The phase comparator of an on-line active unit generates a signal to control the oscillator to maintain its output in phase with the incoming signal. The generated control signal is also connected to capacitor storage in associated channel phase comparators to provide them with an initial starting control voltage when they are switched in to be the receiving channels. Thus eliminating the uncontrolled operation of the oscillator during switching interval.

8 Claims, 1 Drawing Figure

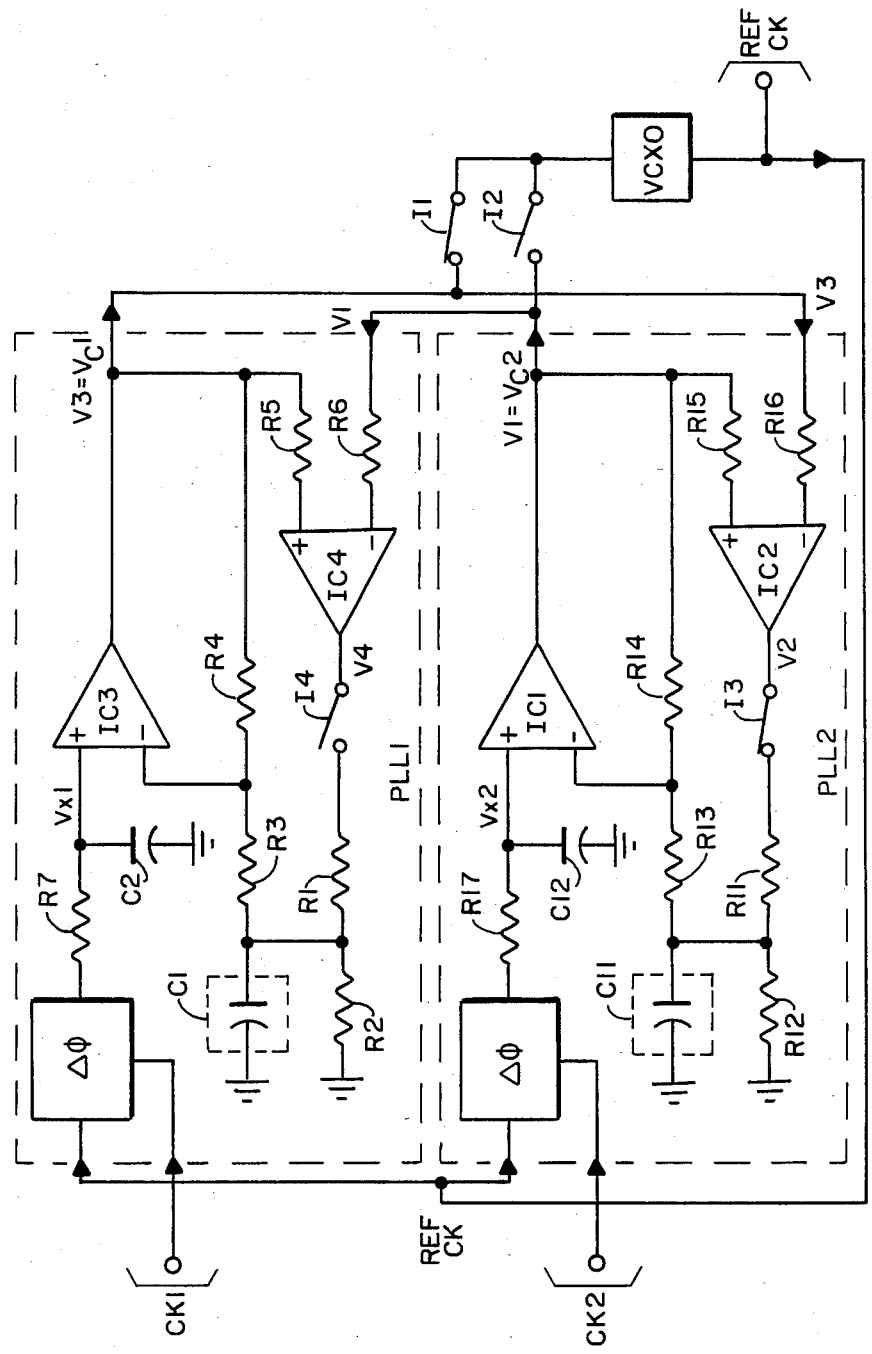

CIRCUIT FOR LIMITING JITTER TRANSIENTS DURING SWITCHING OF PHASE CONTROL SIGNALS TO AN OSCILLATOR

FIELD OF THE INVENTION

The present invention relates to PCM switching and more particularly to an arrangement for eliminating the effects of hits during switching between the two digital signals.

BACKGROUND OF THE INVENTION

It is known that during switching between two digital signals of the same character, which are received with a different phase, the resultant jitter transient must be kept within the amplitude and frequency limits which are predetermined by the international recommendation (recommendation G. 703 of CCITT) to secure the desired quality of the resultant digital signal downstream of the switching operation.

An already known solution to this problem is to utilize the alignment word of the received digital signal prior to switching for synchronizing the freqeuency of the clock signal of the digital signal downstream of the switch.

This solution theoretically avoids the jitter transient of the digital signal during the switching transient, but involves the use of an alignment word detection circuit which is rather complex to provide.

SUMMARY OF THE INVENTION

It is the object of the present invention to obviate these and other disadvantages of the prior art hitless switching.

More particularly the method according to the invention of limiting the jitter transient of a PCM signal during switching is characterized in that a control voltage of a voltage controlled oscillator is applied to an electric circuit before the switching between the two digital signals occurs and this control voltage maintains under control the voltage controlled oscillator during the switching transient and maintains it in phase.

The invention relates also to an electrical circuit for carrying out said method.

This electrical circuit is characterized in that it comprises a negative feedback loop consisting of a first operational amplifier to whose input the control voltage of the voltage controlled oscillator is applied before the switching occurs and a memory circuit which during the switching transient maintains the output voltage from a second operational amplifier at a value equal to the control voltage of the oscillator prior to switching.

The hitless switching according to the present invention maintains the resultant jitter transient within the predetermined limits by providing a circuit which has the advantages of being simpler and less expensive with respect to prior art solutions.

BRIEF DESCRIPTION OF THE DRAWING

These and other features of the present invention will become more apparent from the following description of a preferred embodiment thereof, given merely by way of example and in no limiting sense, referring to the accompanying drawing, whose single FIGURE is a block diagram of the electric circuit according to the present invention.

DETAILED DESCRIPTION

Referring to the FIGURE, CK1 indicates the clock signal of a digital signal at input 1; CK2 indicates the clock signal of a digital signal at input 2; REF CK indicates the reference clock signal which is generated by a conventional voltage controlled quartz oscillator VCXO and is applied to the inputs of the two identical automatic phase control circuits PLL1 and PLL2, which alternativly control the phase of the voltage controlled quartz oscillator VCXO in a similar manner.

I1 and I2 indicate switches which, according to a predetermined logic, determine the phase latching of the oscillator VCXO to the clock signal of the digital signal at input 1 labeled CK 1 through the phase control circuit PLL1 or the digital signal at input 2 labeled CK 2 through the phase control circuit PLL2.

$\Delta\Phi$ indicates a conventional phase comparator circuit which compares the phase of the clock signal of the digital signal at input 1 (CK1) or 2 (CK2) with the phase of the reference clock signal REF CK.

The signal $V \times 1$ indicates the direct voltage, having a magnitude proportional to the phase difference between the two input signals CK1 and REF CK to the phase comparator $\Delta\Phi$, at the input to the operational amplifier IC3.

The signal V3 indicates the voltage at the output of the operational amplifier IC3, which is equal to the control voltage VC1 of the voltage controlled quartz oscillator VCXO when the switch I1 is closed and simultaneously the switch I2 is open. This same voltage V3 is also applied to a first input of the operational amplifier IC4 of the phase control circuit PLL1 and to a first input of the operational amplifier IC2 of the phase control circuit PLL2.

The signal $V \times 2$ indicates the direct voltage having a magnitude proportional to the phase difference between the two input signals CK2 and REF CK to the phase comparator $\Delta\Phi$ of phase control circuit PLL2, at the non-inverting input to the operational amplifier IC1.

The signal V1 indicates the output voltage from the operational amplifier IC1 which is equal to the control voltage of the voltage controlled quartz oscillator VCXO when the switch I2 is closed and simultaneously the switch I1 is open. This same voltage V1 is also applied to a second non-inverting input of the operational amplifier IC2 of phase control circuit PLL2 and to a second inverting input of the operational amplifier IC4 of the phase control circuit of PLL1.

The signal V2 indicates the output voltage from the operational amplifier IC2 of the phase control circuit PLL2; I3 indicates a switch which is closed when the switch I1 is closed and the switch I2 is open. The closure of switch I3 makes it possible to apply the signal voltage V2 to the memory circuit of the phase control circuit PLL2 consisting of the resistances R11, R12 and the capacitor C11. The resistor R13 is a matching resistor between the output of the memory circuit and a second inverting input of the operational amplifier IC1 of the phase control circuit PLL2.

The signal V4 indicates the output voltage from the operational amplifier IC4 of phase control circuit PLL1; I4 indicates a switch which is closed when the switch I2 is closed and the switch I1 is open, and under such conditions applies the signal voltage V4 to the memory circuit of the phase control circuit PLL1 consisting of the resistances R1, R2 and the capacitor C1; R3 designates a matching resistance between the output of the memory circuit and a second inverting input of the operational amplifier IC3 of the phase control circuit PLL1.

The principle of operation of the circuit according to the present invention will be explained referring in particular to the FIGURE.

Assuming that the voltage controlled quartz oscillator VCXO is phase latched to the clock signal of the digital signal at the first input CK1, the switches I1 and I3 are closed and the switches I2 and I4 are open.

The voltage V3=VC1, besides controlling the phase of the voltage controlled quartz oscillator VCXO, is applied to the input of the operational amplifier IC2 of the phase control circuit PLL2 and provides at its output a voltage V2 which charges the memory circuit consisting of capacitor C11 and resistors R11 and R12 of the phase control circuit PLL2; this provides at the input of operational amplifier IC1 of the phase control circuit PLL2 a negative feedback voltage such as to maintain the output signal voltage V1 from the operational amplifier IC1 of the phase control circuit PLL2 at a value equal to VC1, independently of the value of the input signal voltage V×2.

When the switching between the digital input signals occurs, i.e. the voltage controlled quartz oscillator VCXO is phase latched to the clock signal of the digital signal at the second input CK2, the switches I1 and I3 are opened and the switches I2 and I4 are closed.

The control voltage for the voltage controlled quartz oscillator VCXO at the first moment is V1=Vc1 and is maintained at the same value by the charge voltage of the capacitor C11.

The signal voltage V1 will then tend to reach the new value VC2 equal to the new value of the control voltage of the oscillator VCXO at a rate equal to that of the discharge of the capacitor C11 through R12.

The discharge time constant for this memory comprised of the capacitor C11 and resistor R12 is given by T=C11 R12 and is dimensioned in such a manner that the jitter transient imparted to the signal is within the amplitude and frequency limits predetermined by the international recommendation (recommendation G.703 of CCITT).

After the switching transients subside the phase control circuit PLL1 operates as described above for phase control circuit PLL2.

The voltage V1=VC2, besides controlling the phase of the voltage controlled quartz oscillator VCXO, is applied to the input of operational amplifiers IC4 of the phase control circuit PLL1 and determines at its output a signal voltage V4 which charges the memory circuit of the phase control circuit PLL1; this then establishes at the input of operational amplifier IC3 of PLL1 a degenerative voltage such as to maintain the signal voltage V3 at the output from operational amplifier IC3 of PLL1 at a value equal to VC2, independently of the value of the input voltage V×1.

What is claimed is:

1. An arrangement for limiting jitter transients during the interval of switching between a first and a second channel comprising:
    a constant frequency oscillator including an output and a control input,
    a first and a second phase detector each having an input connected to an associated incoming channel and another input connected to said oscillator output, including other means operative to detect phase differences between said inputs and developing a control voltage proportional thereto,
    connect means for selectively impressing said control voltage from one of said first and second phase detectors onto said oscillator control input for accordingly changing the phase of said oscillator output signal, to conform with said input phase differences, each said phase detector further including a control voltage storage means,
    and other connect means operated to selectively impress said control voltage from said one of said first and second phase detectors to the storage means of the other one of said first and second phase detectors, whereby said other one of said phase detectors has available a control voltage to apply to said oscillator upon operation to an active state.

2. An arrangement as claimed in claim 1 wherein each said phase detector further includes a phase comparator and a first operational amplifier, said phase comparator having an output, and a first and a second input connected respectively to said oscillator output and said associated incoming channel, said operational amplifier having a first and a second input and an output, filter means connecting said comparator output to said operational amplifier's first input, said operational amplifier output comprising said control voltage.

3. An arrangement as claimed in claim 2 further including a feedback path from said first operational amplifier output to said operational amplifier second input.

4. An arrangement as claimed in claim 3 further including a resistor in said feedback path.

5. An arrangement as claimed in claim 2 including switch in said first and second phase detectors operated to maintain said operational amplifier output disconnected from said associated first or second phase detection storage means respectively when in an active state.

6. An arrangement as claimed in claim 2 wherein said other connect means includes a second operational amplifier having an output connected to said storage means.

7. An arrangement as claimed in claim 1 wherein said storage means comprises a capacitor.

8. An arrangement as claimed in claim 7 including resistive means connecting said storage means capacitor to said first operational amplifier second input.

* * * * *